United States Patent [19]

Hafeman et al.

[11] Patent Number: 5,126,966
[45] Date of Patent: Jun. 30, 1992

[54] HIGH SPEED LOGIC SIMULATION SYSTEM WITH STIMULUS ENGINE USING INDEPENDENT EVENT CHANNELS SELECTIVELY DRIVEN BY INDEPENDENT STIMULUS PROGRAMS

[75] Inventors: Dan R. Hafeman, Sunnyvale; William Fazakerly, Saratoga; William Loesch, Foster City, all of Calif.

[73] Assignee: IKOS Systems, Inc., Sunnyvale, Calif.

[21] Appl. No.: 467,297

[22] Filed: Jan. 18, 1990

Related U.S. Application Data

[63] Continuation of Ser. No. 349,932, May 4, 1989, abandoned, which is a continuation of Ser. No. 878,458, Jun. 25, 1986, abandoned.

[51] Int. Cl.⁵ .............................................. G06F 15/16
[52] U.S. Cl. ................................... 364/500; 364/578; 364/921.8; 364/916; 364/916.3; 364/927.94; 364/933.8; 364/933.6; 364/931.41; 364/931.48; 364/221.2; 364/232.3
[58] Field of Search ... 364/578, 488, 489, 200 MS File, 364/900 MS File

[56] References Cited

U.S. PATENT DOCUMENTS

| | | | |
|---|---|---|---|
| 3,961,250 | 6/1976 | Snethen | 371/20 |
| 4,066,882 | 1/1978 | Esposito | 371/27 |
| 4,161,276 | 7/1979 | Sacher et al. | 371/25 |
| 4,306,286 | 12/1981 | Cocke et al. | 364/200 |
| 4,316,259 | 2/1982 | Albrecht et al. | 364/718 |
| 4,342,093 | 7/1982 | Miyoshi | 364/578 |
| 4,527,249 | 7/1985 | Van Brunt | 364/578 |
| 4,571,724 | 2/1986 | Belmondo et al. | 371/25 |
| 4,587,625 | 5/1986 | Marino, Jr. et al. | 364/900 |
| 4,594,677 | 6/1986 | Barlow | 364/578 |
| 4,601,032 | 7/1986 | Robinson | 371/23 |
| 4,622,647 | 11/1986 | Sagnard et al. | 371/27 |
| 4,628,471 | 12/1986 | Schuler | 371/23 |
| 4,644,487 | 2/1987 | Smith | 364/578 |
| 4,656,580 | 4/1987 | Hitchcock, Sr. et al. | 364/200 |
| 4,656,632 | 4/1987 | Jackson | 371/20 |
| 4,725,975 | 2/1988 | Sasaki | 364/900 |
| 4,744,084 | 5/1988 | Beck | 371/23 |
| 4,747,102 | 5/1988 | Funatsu | 371/23 |
| 4,751,637 | 6/1988 | Catlin | 364/200 |
| 4,763,288 | 8/1988 | Deering et al. | 371/23 |
| 4,769,817 | 9/1988 | Krohn et al. | 371/23 |
| 4,775,950 | 10/1988 | Terada | 364/578 |
| 4,782,440 | 11/1988 | Nomizu et al. | 371/23 |
| 4,791,578 | 12/1988 | Fazio et al. | 371/23 |
| 4,821,173 | 4/1989 | Young et al. | 371/23 |

Primary Examiner—Thomas C. Lee
Assistant Examiner—Eric Coleman
Attorney, Agent, or Firm—Skjerven, Morrill, MacPherson, Franklin & Friel

[57] ABSTRACT

A stimulus engine for a logic simulation system is used to interpret a stimulus language and generate test patterns as input to a logic simulator. The stimulus language allows a large test pattern set to be represented as a program. Special purpose hardware interprets this program and generates a sequence of input/output events to the logic simulator. The program interpretation is performed while the logic simulation is executing. Special purpose hardware is used to insure that the stimulus engine is able to generate the input/output events at a rate which does not slow down the logic simulator.

6 Claims, 7 Drawing Sheets

HIGH SPEED LOGIC SIMULATION SYSTEM WITH STIMULUS ENGINE USING INDEPENDENT EVENT CHANNELS SELECTIVELY DRIVEN BY INDEPENDENT STIMULUS PROGRAMS This application is a continuation of application Ser. No. 07/349,932, filed May 4, 1989, now abandoned, which is a continuation of application Ser. No. 06/878,458, filed Jun. 25, 1986, now abandoned.

CROSS-REFERENCE TO RELATED APPLICATION

This application is related to pending patent application Ser. No. 06/878,459, filed Jun. 25, 1986, now U.S. Pat. No. 4,787,061 entitled "Dual Delay Mode Pipelined Logic Simulator", entitled assigned to the same assignee as the present invention, the details of which are hereby incorporated by reference.

BACKGROUND OF THE INVENTION

The present invention relates to a logic simulation system and more particularly to a stimulus engine for an event driven logic simulator.

Event driven logic simulators, whether implemented in software or hardware, represent logic activity as a series of "events." These events consist of a net address, a time parameter and a new logic state for the net. Every net (or node) has a driving device and a unique net address. The time parameter may be in absolute time or a time interval relative to a previous event. The logic state is typically made up of three or more values and three or more strengths. Typical values are logic zero, logic one and undefined. Typical strengths are driving, resistive, and high impedance.

Simulation of a logic network requires that events be presented to the external nets (the I/O pins) of the simulated logic network in order to stimulate logic activity within the network. As longer periods of time are simulated, a larger number of events is required to stimulate the external nets. The files which store these event streams tend to become extremely large, which results in three problems:

1. The memory and disk storage requirements can become excessive.
2. The time required to edit (insert and delete events) these files can become excessive.
3. The time required to present the files to the logic simulator can become excessive since disk access is required during the simulation if the file cannot be stored in local random access memory (RAM).

In addition, the creation of large stimulus files has traditionally been a difficult and time consuming task, since the languages for specification of the stimulus have been closely tied to the simulation algorithms rather than "high level" languages.

SUMMARY OF THE INVENTION

It is an object of the present invention to provide a stimulus processor (or engine) for a logic simulation system.

It is a more particular object to provide a stimulus processor which creates event streams which are compatible with the event structure of a logic simulator (which enables concurrent operation by the logic simulator).

The logic simulation system according to the present invention includes an event driven logic simulator and stimulus processor means for interpreting a stimulus language to generate an event stream concurrently with the operation of the logic simulator. The stimulus processor is able to interpret stimulus programs and create event streams which are compatible with the event structure of a logic simulator. The output events are presented directly to the logic simulator while the logic simulation is executing. As a result, there is no need to store, edit or access large files.

The stimulus programming language supports various high level programmatic constructs. These constructs include looping, subroutine calls, data substitution, function calls and manipulation of the event time parameters. In one preferred embodiment, these features are implemented in hardware and microcode. However, the implementation of the features according to the present invention can be effected in software on conventional computers. The embodiment of the present invention allows the stimulus programs to be entered in a graphical timing diagram format, although the exact nature of the stimulus programming language could be of a more conventional nature.

Other objects, features and advantages of the present invention will become apparent from the following detailed description when taken in conjunction with the accompanying drawings.

DETAILED DESCRIPTION OF THE DRAWINGS

Figure 1:
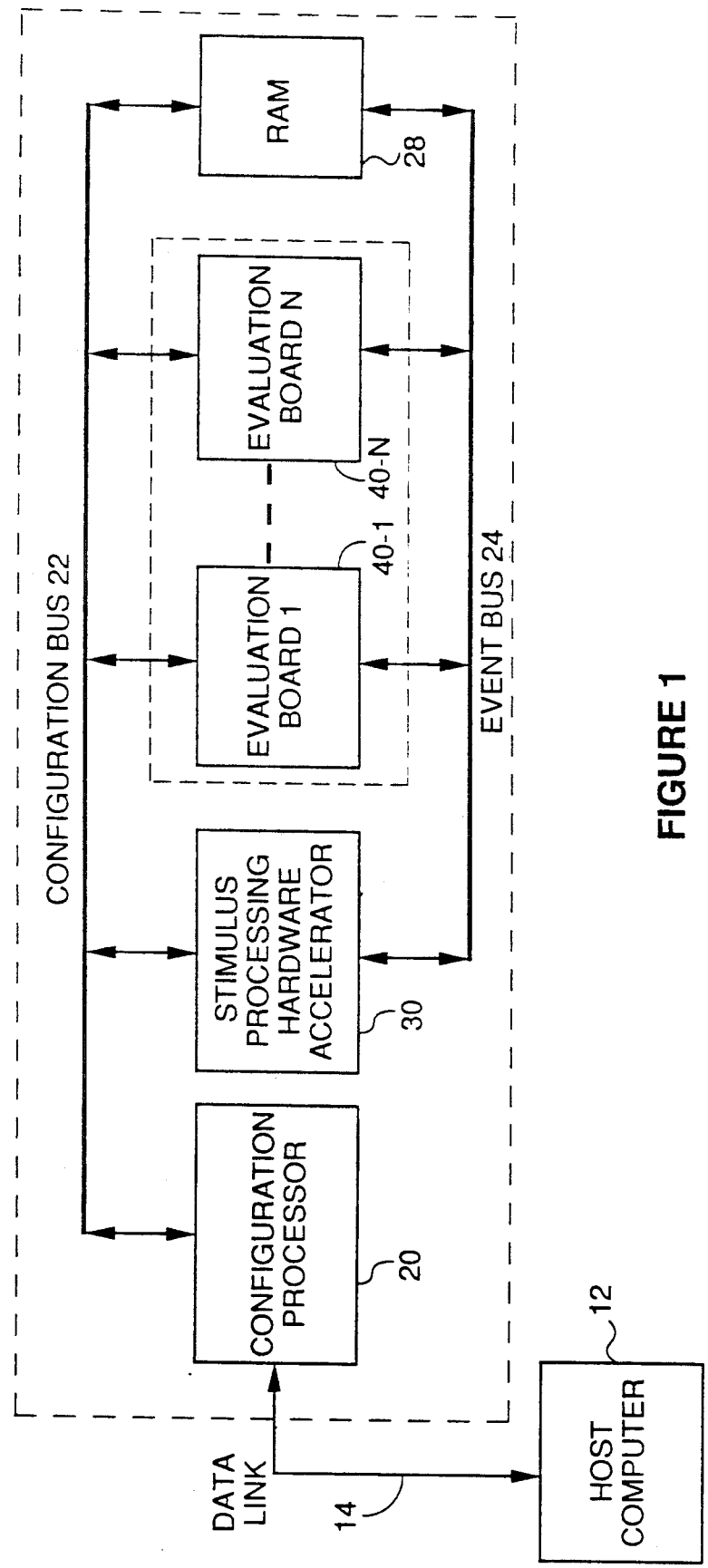
FIG. 1 depicts a block diagram of a logic simulation system which includes a stimulus processor according to the present invention.

Referring now to FIG. 1, a block diagram of a logic simulator system 10 is depicted, which is connected to a suitable host computer 12 via a high speed data link 14. The logic simulator system 10 includes a configuration processor 20 which communicates by a configuration bus 22 to the other components depicted in the system 10.

The logic simulator system 10 includes a stimulus processing hardware accelerator 30 which is connected to an event bus 24. The stimulus accelerator 30 provides high-speed presentation of stimulus events and run-time comparison of simulation outputs to expected outputs. Further details of the operation of the stimulus processing hardware accelerator 30 are described in more detail below.

Referring again to FIG. 1, the configuration processor 30 communicates to a plurality of evaluator boards (such as evaluator boards 40-1 through 40-N) which form the logic simulator. In one embodiment, the logic simulator system 10 includes up to 15 evaluator boards, although other variations are possible.

The logic simulator system 10 also includes a local random access memory (RAM) 28.

The configuration processor is connected to the accelerator 30, evaluator boards 40 and RAM 28 via the configuration bus 22. The accelerator 30, evaluator boards 40 and RAM 128 also communicate via the event bus 24.

Referring now to FIG. 2. a block diagram of the stimulus processing hardware accelerator 30 of FIG. 1 is depicted in more detail.

A stimulus program is accessed through the RAM 28 of FIG. 1 through the memory interface 60 of FIG. 2 (specifically main memory part 62) under control of the processor system 70.

Processor system 70 includes a control store 72, a sequencer 74, an external request decoder 76, a vector decoder 78 and an arithmetic and logic unit (ALU) 80.

Vector decoder 78 recognizes if an instruction in the stimulus program requires microcode operation (such as a loop) or if it is a simple event. The simple events are passed to the proper channel of event channels 100, as will be described. The more complex instructions are implemented in microcode and special purpose hardware.

Figure 2A:
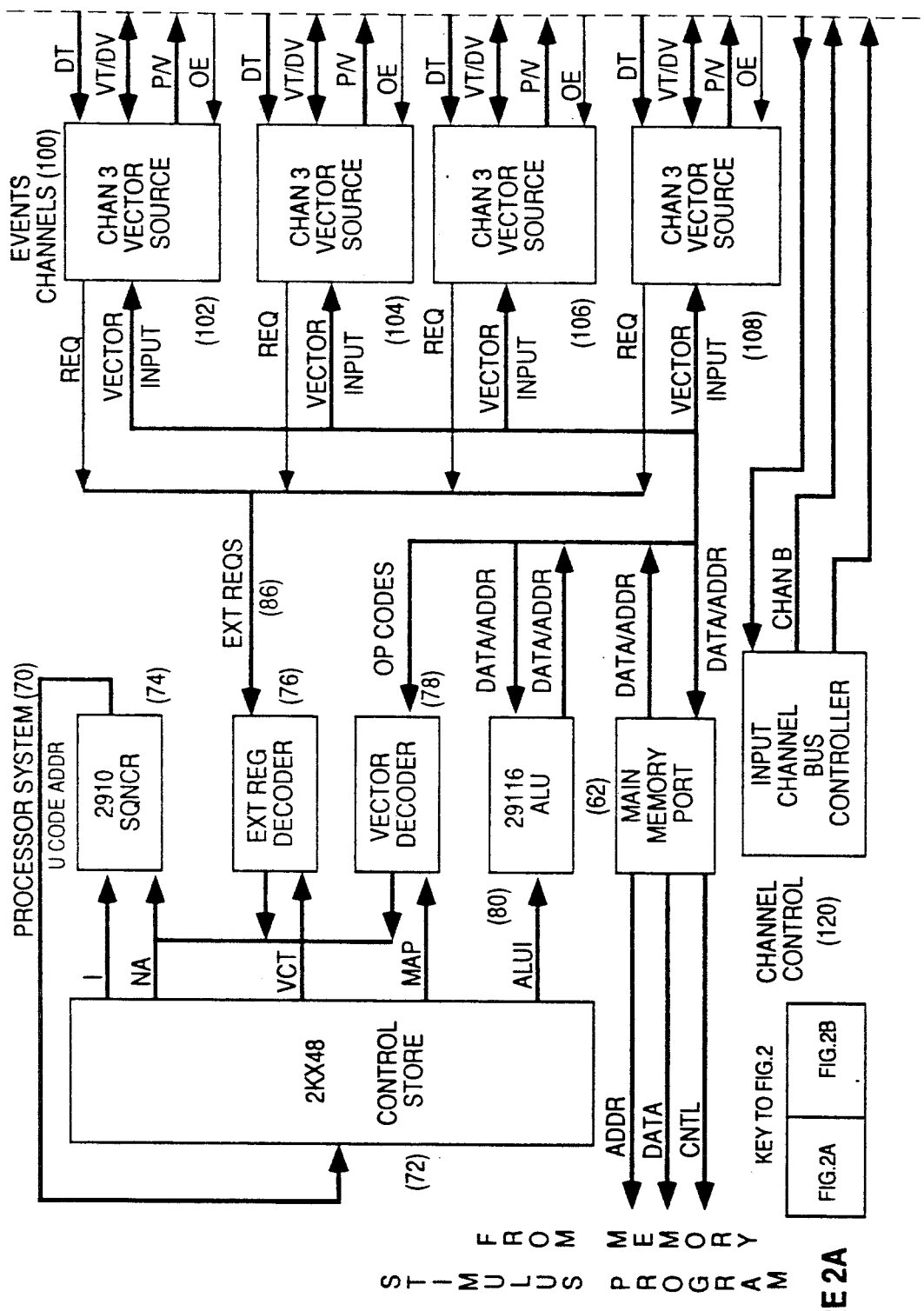
FIGS. 2A and 2B, when placed side-by-side, depict a block diagram of the stimulus processor architecture according to the present invention.

In FIG. 2A, the stimulus processor architecture includes four event channels, which are channels 102, 104, 106 and 108. Each of the four channels in FIG. 2A are driven by an independent stimulus program. The event channels 100 are FIFO (first in, first out) based. When a particular channel is not full, the REQ signal on bus 86 is asserted. Then the REQ signal is deasserted and the processor system 70 switches to another event channel program in a round robin fashion.

The events arrive at the channel output of event channels 100 out of time sequence. Hardware in the clock control logic 150 in FIG. 2B arbitrates between channels and evaluation units in the logic simulator (the evaluator boards 40 of FIG. 1) to insure that the events to the simulation are correctly time sorted.

Figure 2B:
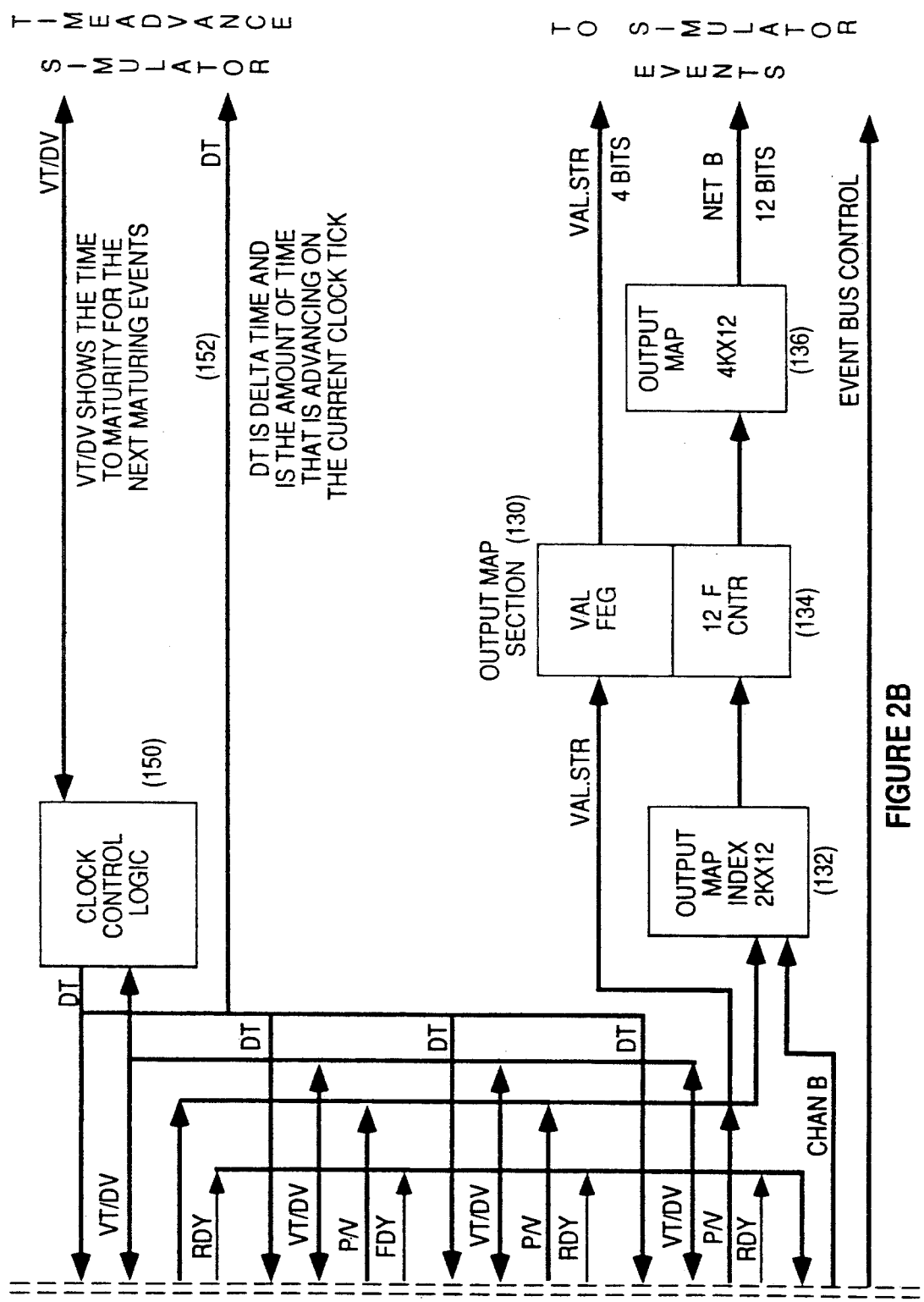

In FIG. 2B, the output map section 130 comprises an output map index 132, a twelve bit counter 134 and an output map memory 136. The output map section 130 allows 512 pins from each channel to be mapped into any one of the nets supported by the logic simulator 40 of FIG. 1. The mapping algorithm reduces the number of bits required to store an event in memory, since the number of nets allowed in a simulation may be extremely large. However, the number of input and output signals from the simulation is held to a minimum by design.

Figure 3A:
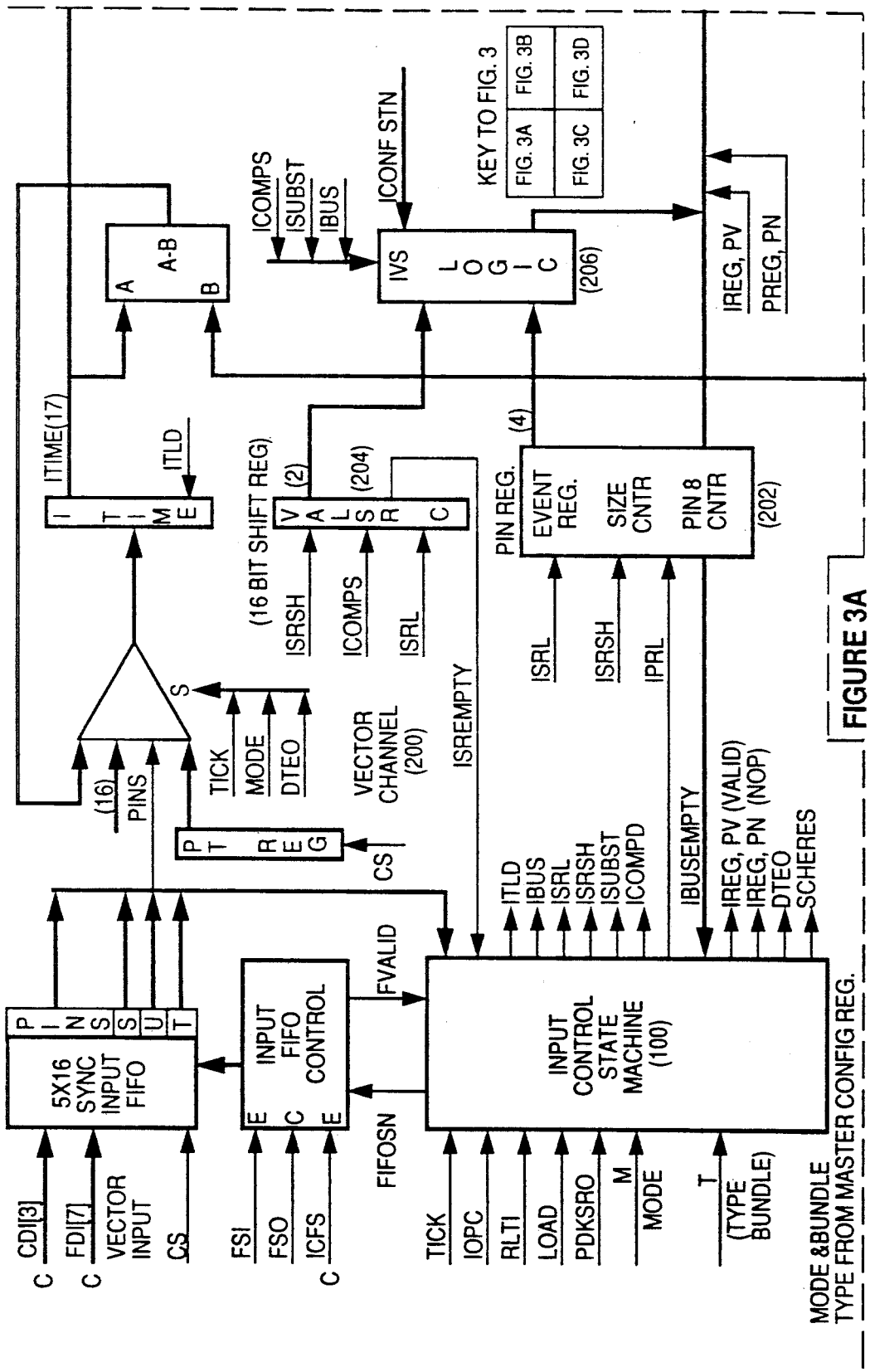
FIGS. 3A, 3B, 3C and 3D, when placed side-by-side, depict a block diagram of an event channel, which forms a portion of FIG. 2.
Figure 3B:
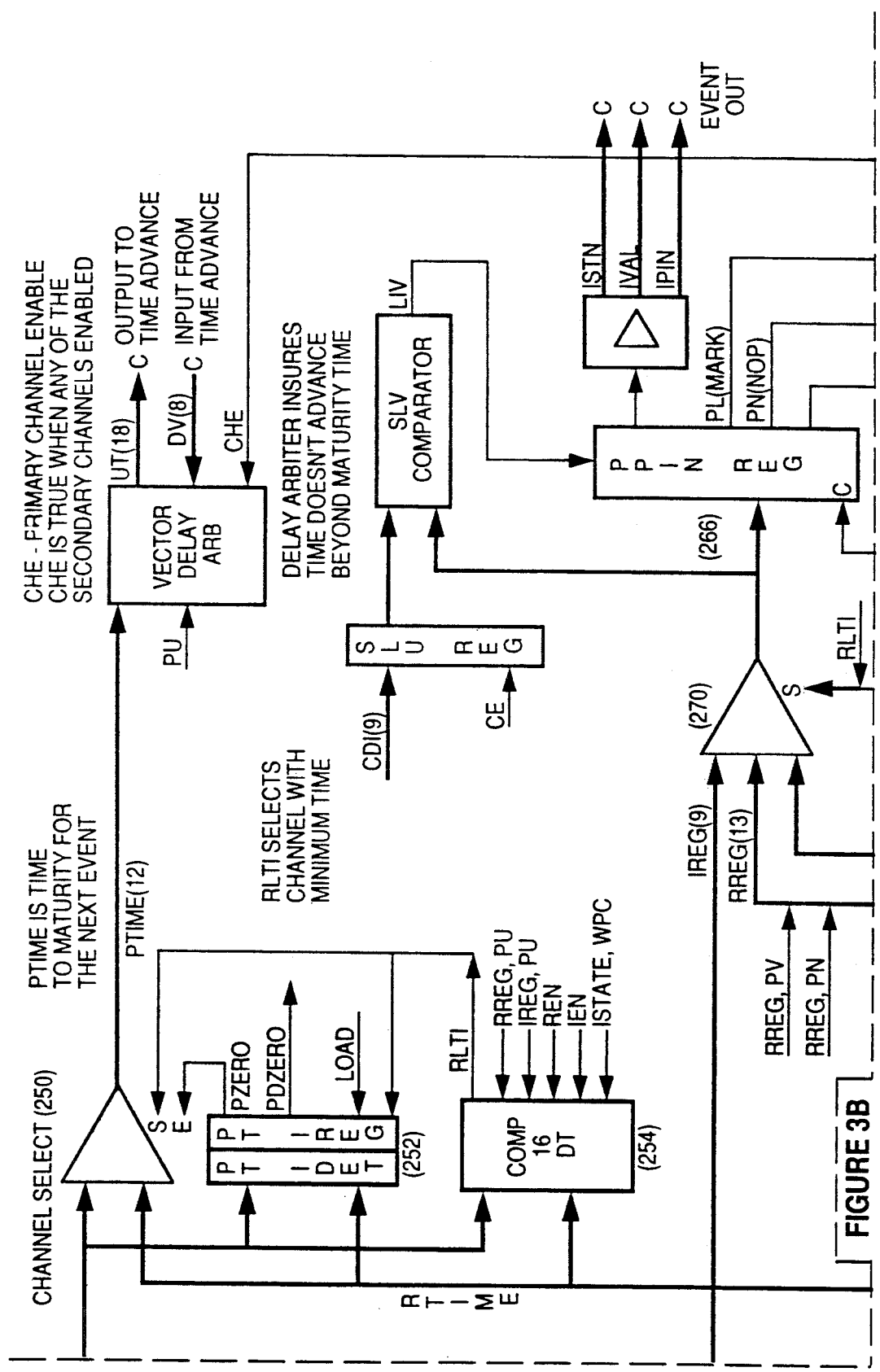
Figure 3C:
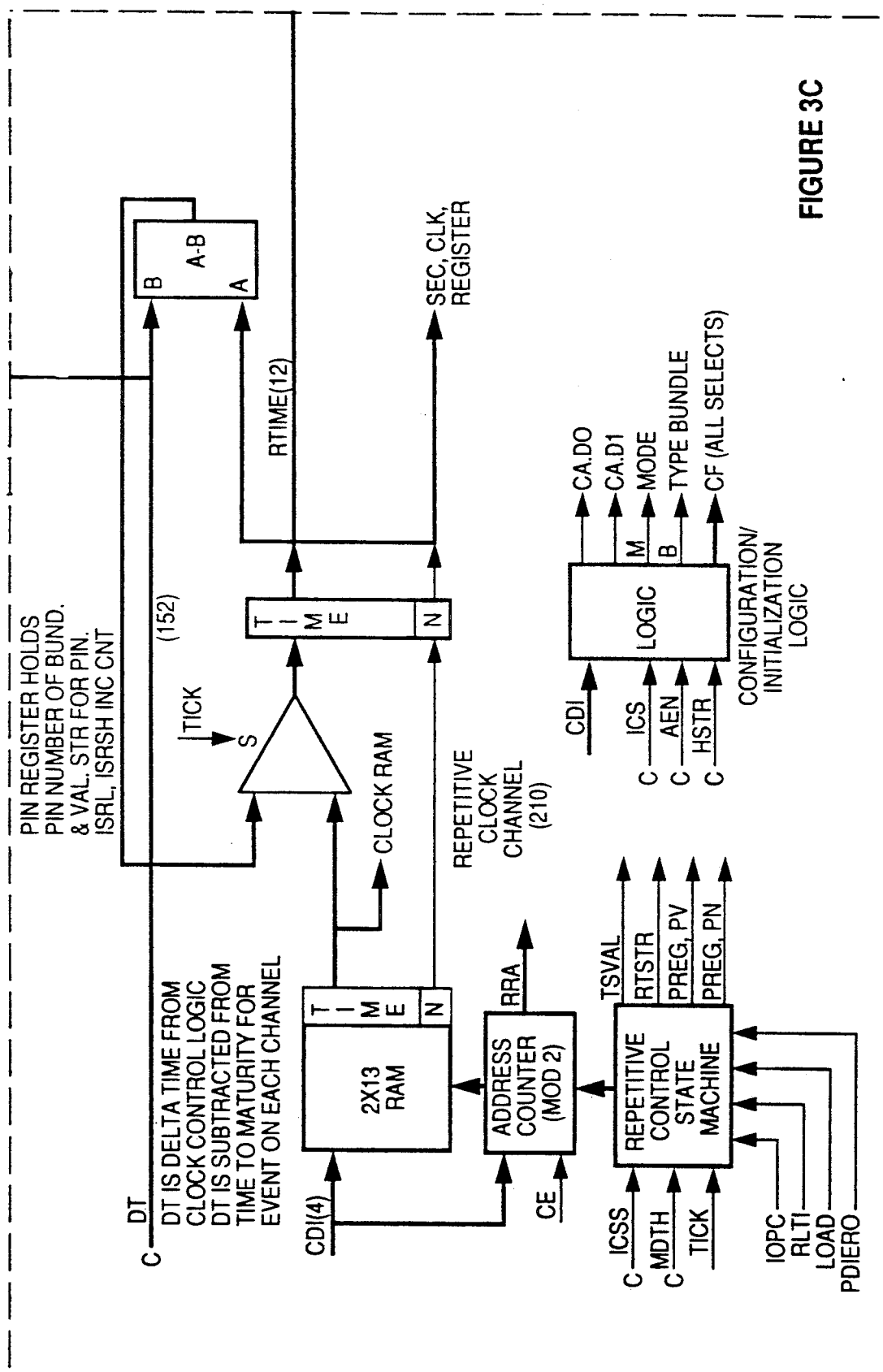

FIGS. 3A, 3B, 3C and 3D depict a block diagram of the event channel architecture depicted in FIGS. 2A and 2B. In FIGS. 3A and 3B, each event channel includes two subchannels, which are a vector channel 200 and a repetitive clock channel 210. The vector channel 200 accepts the vector input from the processor system 70 of FIG. 2A.

The repetitive clock channel 210 generates repetitive signals without requiring continuous input from the processor system 70 of FIG. 2A. The channel select logic 250 multiplexes the vector channel 200 and repetitive clock channel 210 as a function of time to maturity for the waiting events on each channel. The comparator 254 compares the time to maturity for each channel and generates the RLT1 signal to both the channel select logic 250 and the channel select multiplexers 270,272.

The DV bus 262 and VT bus 260 communicate with the stimulus engine clock control logic 150 of FIG. 2B. The VT bus 260 indicates to the clock control logic 150 how much time must elaspse before the next event matures in the channel. The DV bus 262 is used to control the incrementing logic in the clock control logic 150. Once the clock control logic 150 has determined which event channel, or simulation evaluation unit, has the next maturing event, the DT bus 152 of FIG. 2B is output with the amount of time which is elapsing (DT is delta time and is the amount of time that is advancing on the current clock tick).

When the TICK signal is asserted, the DT bus 152 value is subtracted from the remaining time to maturity for the events in all of the event channels, and the simulation evaluation units. The time remaining to maturity is thereby reduced by the delta time (DT) and the new time to maturity is input by both subchannels (vector channel 200 and repetitive clock channel 210) to the channel select logic 250 of FIG. 3B.

Figure 3D:
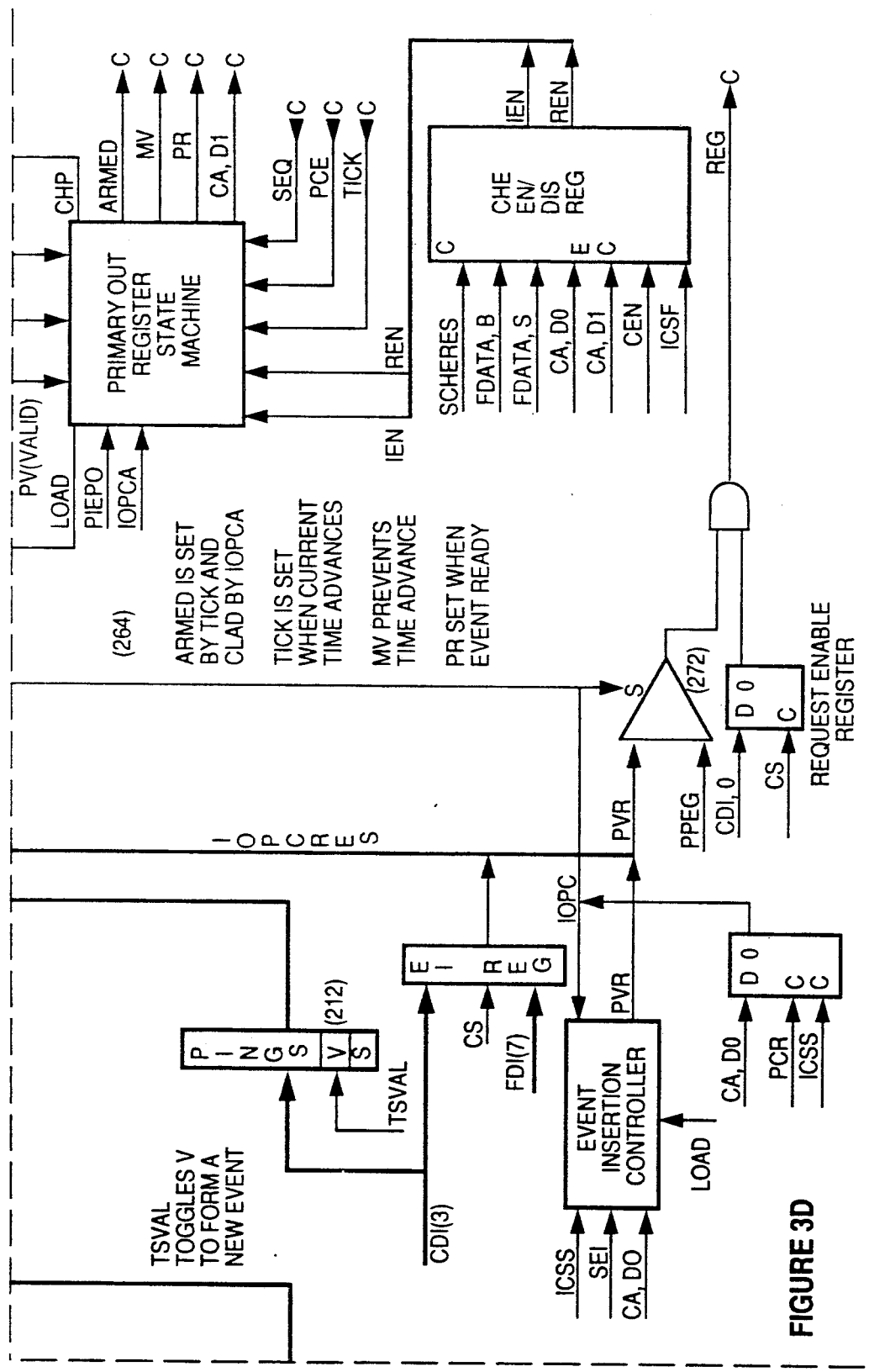

When the time to maturity has gone to zero, the waiting event is mature. The Zero Detect Logic, indicated by numeral 252 in FIG. 3B, drives the Primary Out Register State Machine, generally indicated by numeral 264 of FIG. 3D, to allow the event to be presented to the simulator 40 of FIG. 1. The new value and strength for the pin is sourced by the PPIN register 266 of FIG. 3B. The subchannel which provides the new value and strength is multiplexed in the same manner as the time (i.e., the RLTI signal controls both channel select multiplexers 270, 272, as depicted in FIGS. 3B and 3D). The value and strength at the clock channel events is held in register 212. The value always toggles between logic 0, strength 2 and logic 1, strength 2, as controlled by the TQVAL signal. The value and strength for the event on the vector channel is determined by the input control state machine 100, which controls the PIN REG 202, the VALS REG 204 and the IVS logic 206. PIN REG 202 is a counter which can sequence PIN #'s for a bus which the individual PIN values are set into the VAL REG 204. The PIN #'s value is merged on to the IREG bus under control of the IVS logic 206.

What is claimed is:

1. In a logic simulator for simulating a plurality of simulated logic devices, each said simulated logic device having at least one input and at least one output, said logic simulator including logic evaluator means; said simulator including:
   stimulus processor means for controlling logic states of inputs of said simulated logic devices when said simulated logic device inputs are not connected to other of said simulated logic device outputs, said stimulus processor means including:
   a plurality of independent event channels, each of said event channels being driven by an independent stimulus program containing one or more instruction sequences;
   program memory means for storing one or more of said instruction sequences of said stimulus programs, means for interpreting said stored instruction sequences to produce a sequence of input logic states, and
   means for supplying said sequence of input logic states from said interpreting means to said logic evaluator means to cause said logic evaluator means to respond to said sequence of input logic states produced by said interpreting means, said response of said logic evaluator means to any given sequence of input logic states occurring essentially concurrently with the production of said given sequence of input logic states by said stimulus processor means.

2. A stimulus processor as in claim 1 including:
   means for connecting each of said independent event channels to any selected group of said simulated logic device inputs, and after said independent event channel has been connected to said selected group of logic device inputs, said instruction sequences being interpreted to produce said sequence of input logic states to said selected group of said simulated logic device inputs.

3. A stimulus processor as in claim 2 wherein said plurality of independent channels may be synchronized to one another or to said simulated logic devices with a synchronization instruction, said synchronization instruction being one of said instructions in said stored instruction sequence.

4. A stimulus processor as in claim 3 wherein said synchronization instruction tests the state of any said output of any of said simulated logic devices, said synchronization instruction thereby allowing said sequence of input logic states to be temporarily suspended until a particular combinational state occurs in said simulated logic device outputs.

5. A stimulus processor as in claim 3 wherein said synchronization instruction tests the state of any said input of any of said simulated logic devices when said input is connected to any of said independent channels, said synchronization instruction thereby allowing said sequence of input logic states to be temporarily suspended until a particular combinational state occurs in said simulated logic device inputs.

6. A stimulus processor as in claim 3 wherein said synchronization instruction tests the state of any said input or said output of any of said simulated logic devices, said synchronization instruction thereby allowing said sequence of input logic states to be temporarily suspended until a particular combinational state occurs in said simulated logic device inputs and outputs.

* * * * *